(12) United States Patent
Park

(10) Patent No.: US 6,656,783 B2
(45) Date of Patent: Dec. 2, 2003

(54) SEMICONDUCTOR DEVICE HAVING SHALLOW TRENCH ISOLATION STRUCTURE AND MANUFACTURING METHOD THEREOF

(75) Inventor: Joo-Wook Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/255,526

(22) Filed: Sep. 25, 2002

(65) Prior Publication Data

US 2003/0030076 A1 Feb. 13, 2003

Related U.S. Application Data

(62) Division of application No. 09/998,018, filed on Nov. 29, 2001, now Pat. No. 6,486,517.

(30) Foreign Application Priority Data

Dec. 1, 2000 (KR) .................................... 2000-72600

(51) Int. Cl.[7] .................. H01L 21/8238; H01L 21/76
(52) U.S. Cl. ............... 438/221; 438/424; 438/427; 438/435
(58) Field of Search .................... 438/221, 424, 438/427, 435

(56) References Cited

U.S. PATENT DOCUMENTS

| 5,447,884 | A | 9/1995 | Fahey et al. ............... 438/437 |
|---|---|---|---|
| 5,643,823 | A | 7/1997 | Ho et al. ................... 438/437 |
| 5,851,900 | A | 12/1998 | Chu et al. ................. 438/434 |
| 5,960,276 | A | 9/1999 | Liaw et al. ............... 438/224 |
| 5,981,325 | A | 11/1999 | Hung ....................... 438/224 |
| 6,180,467 | B1 | 1/2001 | Wu et al. ................. 438/435 |
| 6,245,641 | B1 | 6/2001 | Shiozawa et al. ......... 438/427 |
| 6,258,692 | B1 | 7/2001 | Chu et al. ................. 438/437 |
| 6,306,725 | B1 | 10/2001 | Nag et al. ................. 438/435 |
| 6,482,715 | B2 * | 11/2002 | Park et al. ............... 438/424 |
| 6,486,039 | B2 * | 11/2002 | Yoo et al. ................. 438/425 |
| 2002/0076900 | A1 | 6/2002 | Park et al. ............... 438/435 |
| 2002/0086495 | A1 | 7/2002 | Yoo etal ................... 438/424 |

FOREIGN PATENT DOCUMENTS

JP      11-220017      8/1999

* cited by examiner

Primary Examiner—T. N. Quach
(74) Attorney, Agent, or Firm—Marger Johnson & McCollom, P.C.

(57) ABSTRACT

A semiconductor device having a shallow trench isolation (STI) structure, which is capable of reducing leakage current in a P-FET and improving the device characteristics of a memory device, and a manufacturing method thereof, including a semiconductor substrate having a first area with a first trench formed therein and a second area with a second trench formed therein; a first sidewall oxide layer formed on the inner surface of the first trench; a second sidewall oxide layer, which is thinner than the first sidewall oxide layer, formed on the inner surface of the second trench; a liner formed on the surfaces of the first and second sidewall oxide layers; and a dielectric material that fills the first and second trenches.

29 Claims, 8 Drawing Sheets

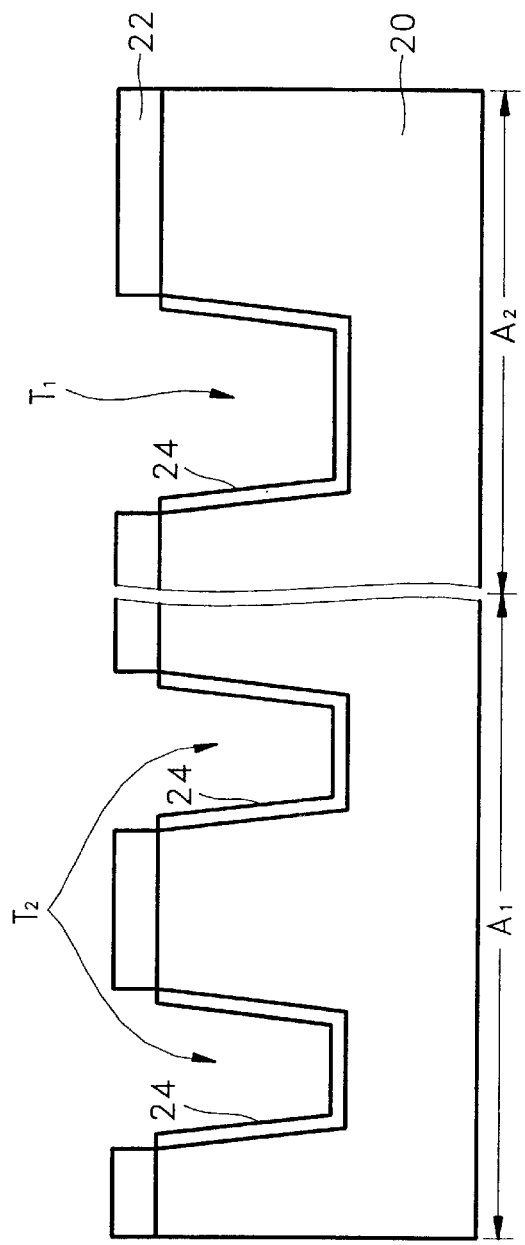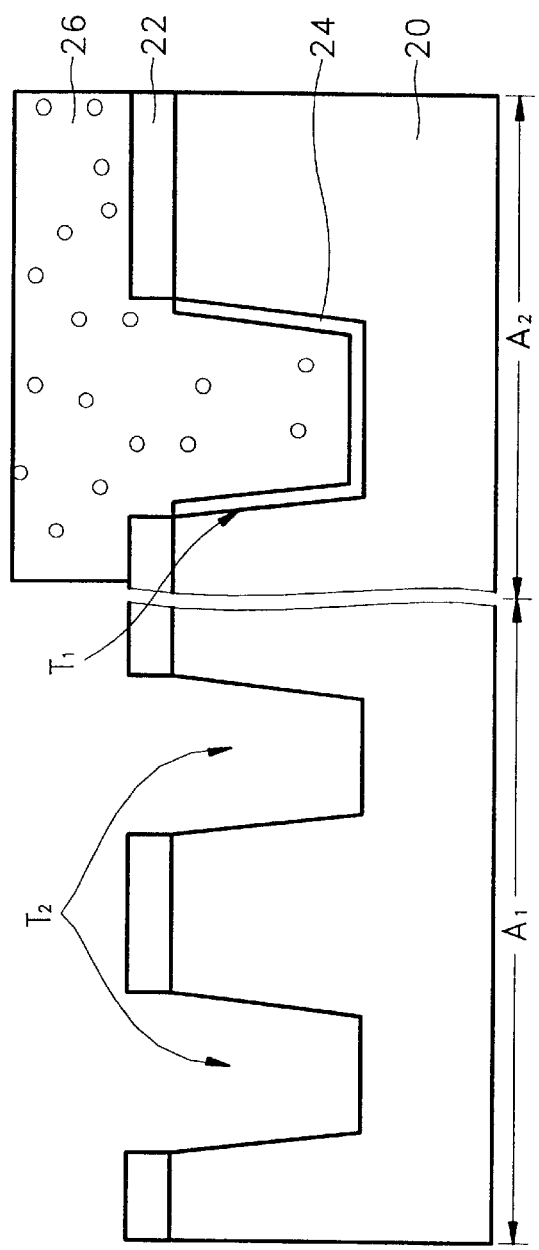
FIG. 3B
FIG. 3C

SEMICONDUCTOR DEVICE HAVING SHALLOW TRENCH ISOLATION STRUCTURE AND MANUFACTURING METHOD THEREOF

This application is a divisional of U.S. patent application Ser. No. 09/998,018. filed on Nov. 29, 2001, U.S. Pat. No. 6,486,517, which is herein incorporated by reference in it's entirety.

BACKGROUND OF THE INVENTION

1. Field of the Invention

The present invention relates to a semiconductor device having an isolation layer and a manufacturing method thereof, and more particularly, to a semiconductor device having a shallow trench isolation structure and a manufacturing method thereof.

2. Description of the Related Art

With the advancement of semiconductor device manufacturing techniques, the speed and integration of semiconductor devices has improved. In addition, small, high-density patterns have been increasingly required. Wide isolation regions in semiconductor devices also require small high density patterns.

Local oxidation of silicon (LOCOS) oxide layers have been mainly used as conventional isolation layers of semiconductor devices. However, bird's beak configurations are created at the edges of the isolation layers by the LOCOS method and thus the area of active regions is reduced, and current leakage occurs.

Presently, shallow trench isolation (STI) layers having narrow widths and excellent isolation characteristics are widely used.

Referring to FIG. 1, a blocking pattern (not shown) is formed on a semiconductor substrate 10 to expose an isolation region. The semiconductor substrate 10 is defined as a cell area, a core area and a peripheral area. In addition, the blocking pattern may be a stack layer comprising an oxide layer and a silicon nitride layer. The exposed semiconductor substrate 10 is etched to a predetermined depth using the blocking pattern as a mask, thereby forming trenches t1 and t2 therein. Herein, the trench t1 may be formed in the cell area and the trench t2 may be formed in the core and peripheral areas. The etching process for forming the trenches t1 and t2 is performed by a dry etching method using a plasma.

The dry etching process for forming the trenches t1 and t2 may cause silicon lattice defects and damage to the inner surfaces of the trenches t1 and t2. Conventionally, to reduce silicon lattice defects and damage, a sidewall oxide layer 12 is formed by thermally oxidizing the inner surfaces of the trenches t1 and t2. At this time, the sidewall oxide layer 12 is formed to a thickness of only 50 to 100A. Also, the formation of the sidewall oxide layer 12 helps the removal of sharp upper and lower corners of the trenches t1 and t2.

Afterwards, a silicon nitride liner 14 is formed on the surface of the sidewall oxide layer 12. The silicon nitride liner 14, as is well known, prevents the generation of stress due to a difference in thermal expansive coefficients of the semiconductor substrate 10 made of silicon and a silicon oxide layer that will be filled into the trenches t1 and t2.

A dielectric material, for example, a high density plasma (hereinafter, referred to as "HDP") oxide layer is deposited over the resultant semiconductor substrate 10 to fully fill the trenches t1 and t2. Next, chemical mechanical polishing (hereinafter, referred to as "CMP") is performed on the HDP oxide layer and the blocking pattern to expose the surface of the semiconductor substrate 10, thereby filling the trenches t1 and t2 with the HDP oxide layers. Consequently, a shallow trench isolation (STI) layer 16 is completed.

However, forming the thin and uniform sidewall oxide layer 12 causes the following problems. With reference to FIGS. 2A and 2B, since hot carriers of a highly integrated semiconductor MOS transistor generally have high energy, they bounce to a thin gate oxide layer 22 or easily penetrate through the sidewall oxide layer 12 into the STI layer 16. Herein, the hot carriers penetrating into the STI layer 16 are mainly negative electric charges, namely, electrons 100, which are easily trapped in the silicon nitride liner 14 and on the interface between the silicon nitride liner 14 and the sidewall oxide layer 12. The electrons 100 are densely trapped since the sidewall oxide layer 12 is remarkably thin as mentioned above. If the electrons 100 are densely concentrated around the edge of the STI layer 16, positive electric charges in semiconductor substrate 10 on which MOS transistors are formed, namely, holes 12 are gathered in the periphery of the STI layer 16. At this time, since the electrons 100 are densely trapped in the silicon nitride liner 14 and on the interface between the silicon nitride liner 14 and the sidewall oxide layer 12, the holes 12 in the semiconductor substrate 10 are densely gathered together.

Herein, as shown in FIG. 2A, since in an N-channel field effect transistor (N-FET) the major carriers are the electrons 100, a path is not formed between n-type junction areas 26a and 26b in which the electrons 100 function as major carriers, even though the holes 102 are dense in the periphery of the STI layer 16.

Because in a P-channel field effect transistor (P-FET) the major carriers are the holes 102, as shown in FIG. 2B, the holes 102 densely arranged at the periphery of the STI layer 16 function as a current path I connecting p-type junction areas 28a and 28b isolated by the STI layer 16. Consequently, due to the current path I, although p-type junction areas 28a and 28b are isolated by the STI layer 16, leakage current, such as abnormally increased standby current after bum-in, is generated between adjacent P-FETs, thereby deteriorating the device characteristics of the P-FETs. Herein, a reference numeral 24 denotes a gate electrode of a MOSFET.

Furthermore, in a case where a P-FET is on the interface between the STI layer 16 and an active region (hereinafter, referred to as "interface"), a channel area of the P-FET (not shown) is opposite to the silicon nitride liner 14 where the electrons are trapped. Here, the thin sidewall oxide layer 12 is interposed between the channel area of the P-FET and the silicon nitride liner 14. Consequently, the electrons trapped in the silicon nitride liner 14 easily induce holes in the channel area of the P-FET on the interface. And, the holes induced in turning on the P-FET are not easily removed and remain after turning off the P-FET. Due to this, the length of the channel of the P-FET on the interface is gradually reduced, thereby changing the threshold voltage. Consequently, the characteristics of the P-FET are changed.

To solve the above problems of the P-FET, techniques for increasing the entire thickness of the sidewall oxide layer 12 have been proposed. However, if the entire thickness of the sidewall oxide layer 12 is increased, oxidants easily penetrate into the sidewall oxide layer 12. Due to the penetration of such oxidants, stress in the N-FET in the cell area connected to a storage capacitor is increased thereby sharply reducing data retention time of the storage capacitor, namely, refresh time. Consequently, the characteristics of a DRAM device are deteriorated.

In summary, if the sidewall oxide layer 12 of the STI is formed to a uniform thickness throughout the entire area, which does not generate abnormally increased standby current after burn-in in the P-FET, then the standby current after burn-in of the P-FET as well as the data retention time of the storage capacitor in the cell area is reduced. If the sidewall oxide layer of the STI is formed to a uniform thickness throughout the entire area, which maintains moderate data retention time of a DRAM device, then the data retention time of the DRAM is maintained while serious abnormally increased standby current after burn-in is generated in the P-FET. Consequently, it is difficult to maintain the characteristics of the P-FET.

Consequently, if sidewall oxide layers in their respective areas are formed to a uniform thickness, it is difficult to simultaneously maintain the excellent device characteristics of the N-FET in the cell area and of the P-FET in the core and periphery areas.

SUMMARY OF THE INVENTION

To solve the above problems, it is an object of the present invention to provide a semiconductor device having a shallow trench isolation (STI) structure, which is capable of reducing abnormally increased standby current after burn-in in a P-FET, maintaining the device characteristics of the P-FET and improving the characteristics of a memory device such as a DRAM device.

It is another object of the present invention to provide a method of manufacturing the semiconductor device having the STI structure.

Accordingly, to achieve the first object, there is provided a semiconductor device having a shallow trench isolation (STI) structure, comprising a semiconductor substrate having a first area with a first trench formed therein and a second area with a second trench formed therein, a first sidewall oxide layer formed on the inner surface of the first trench, a second sidewall oxide layer, which is thinner than the first sidewall oxide layer, formed on the inner surface of the second trench, a liner formed on the surfaces of the first and second sidewall oxide layers, and a dielectric material with which the first and second trenches are filled.

To achieve the second object, there is provided a semiconductor device having an STI structure, comprising a semiconductor substrate having core and periphery areas in which a P-FET and other circuit devices are formed, a cell area in which memory devices are formed, and first and second trenches for isolating devices formed in the cell area and core and periphery areas, a first sidewall oxide layer formed on the inner surface of the first trench, a second sidewall oxide layer, which is thinner than the first sidewall oxide layer, formed on the inner surface of the second trench, a liner formed on the surfaces of the first and second sidewall oxide layers, and a dielectric material with which the first and second trenches are filled, wherein the first trench is formed in the core and periphery areas and the second trench is formed in the cell area. Also, the first trench may be formed in an area for dividing P-FETs in the core and periphery areas and the second trench may be formed in the cell area and in an area for dividing N-FETs, an N-FET and a P-FET, an N-FET and other circuit devices, a P-FET and other circuit devices, and other circuit devices in the core and periphery areas. The first sidewall oxide layer has a thickness capable of preventing a significant increase in standby current after burn-in in the P-FET. The second sidewall oxide layer has a thickness that does not appreciably reduce a predetermined data retention time of a memory device.

According to the second preferred embodiment of the present invention, there is provided a method of manufacturing a semiconductor device having an STI structure. In the method, a first trench and a second trench are formed in selective areas of a semiconductor substrate. A first sidewall oxide layer is formed on the inner surface of the first trench and a second sidewall oxide layer is formed on the inner surface of the second trench. The first and second trenches are filled with a dielectric material. It is preferable that the second sidewall oxide layer be thinner than the first sidewall oxide layer.

According to the third preferred embodiment of the present invention, there is provided a method of manufacturing a semiconductor device having an STI structure. A semiconductor substrate having core and periphery areas in which a P-FET and other circuit devices are formed and a cell area in which a memory device is formed is provided. A first trench and a second trench are formed in the core area, the periphery area, and an area for device isolation in the cell area of the semiconductor substrate. An initial oxide layer is formed on the inner surfaces of the first and second trenches. The initial oxide layer in the second trench is removed. First and second sidewall oxide layers are formed on the inner surfaces of the first and second trenches by oxidizing the initial oxide layer in the first trench and the inner surface of the second trench. The first and second trenches are filled with a dielectric material. The first sidewall oxide layer is thicker than the second sidewall oxide layer.

According to the fourth preferred embodiment of the present invention, there is provided a method of manufacturing a semiconductor device having an STI structure. In the method, a semiconductor substrate having core and periphery areas in which a P-FET and other circuit devices are formed and a cell area in which a memory device is formed is provided. A first trench and a second trench are formed in the core area, the periphery area and a pre-isolation area in the cell area of the semiconductor substrate. A first sidewall oxide layer is formed to a predetermined thickness on the inner surfaces of the first and second trenches. A second sidewall oxide layer is formed by etching the first sidewall oxide layer in the second trench to a predetermined thickness. The first and second trenches are filled with a dielectric material. The first trench is formed in the core and periphery areas and the second trench is formed in the cell area. The first trench may be formed in an area for diving P-FETs in the core and periphery areas and the second trench may be formed in the cell area and in an area for diving N-FETs, an N-FET and a P-FET, an N-FET and other circuit devices, and a P-FET and other circuit devices, and other circuit devices in the core and periphery areas. Preferably, the first sidewall oxide layer in the first trench is formed to a thickness capable of preventing a significant increase in standby current after burn-in in the P-FET, and the second sidewall oxide layer is formed to a thickness that does not appreciably reduce a predetermined data retention time of a memory device.

BRIEF DESCRIPTION OF THE DRAWINGS

The above objectives and advantages of the present invention will become more apparent by describing in detail a preferred embodiment thereof with reference to the attached drawings in which:

FIGS. 3A to 3E are cross-sectional views for describing steps of a manufacturing method of a semiconductor device having an STI structure according to an embodiment of the present invention;

DESCRIPTION OF THE PREFERRED EMBODIMENTS

Figure 1:
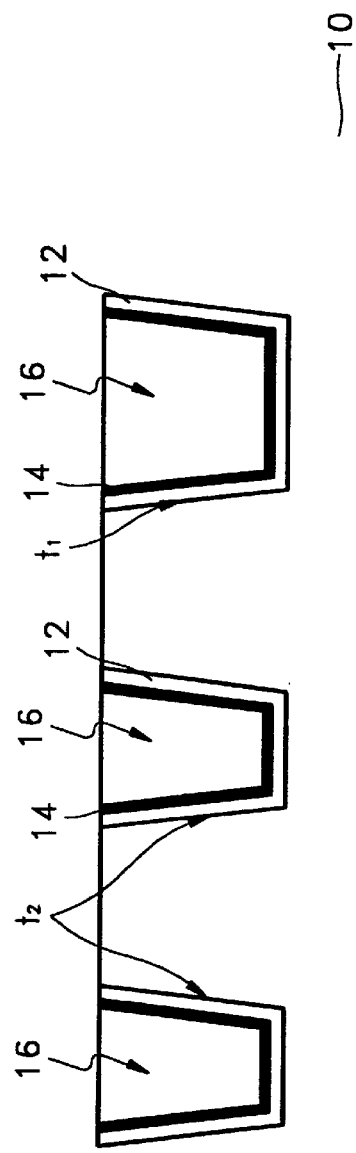
FIG. 1 is a cross-sectional view for describing a semiconductor device having a conventional STI structure.

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Embodiment 1

Figure 3A:
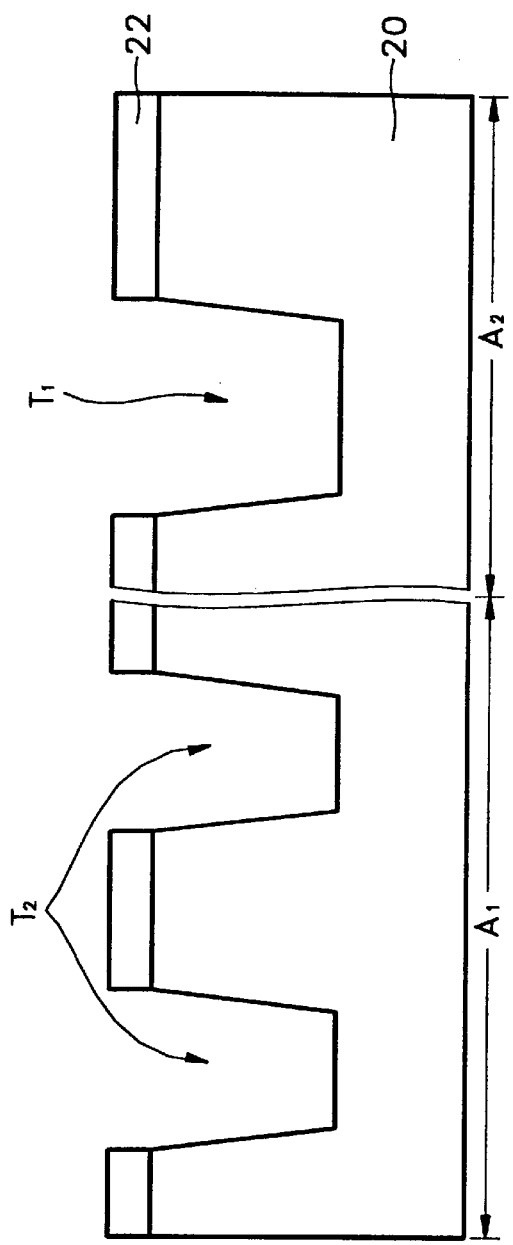
Figure 2A:
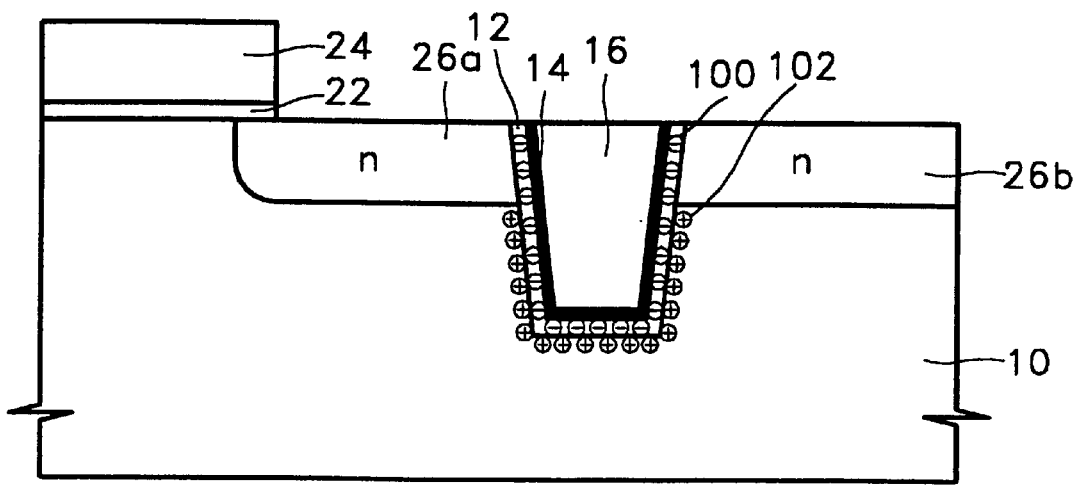
FIG. 2A is a cross-sectional view illustrating an N-FET isolated by the conventional STI structure.
Figure 2B:
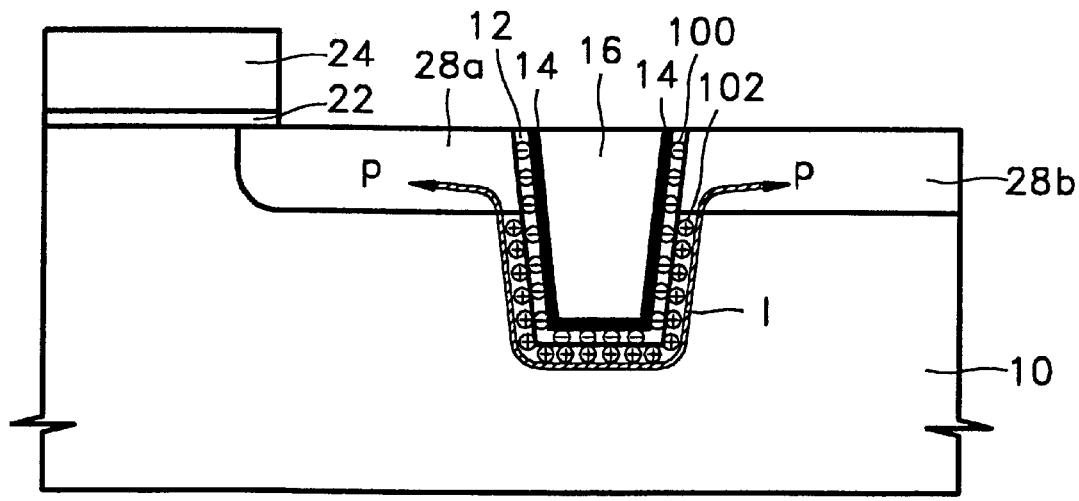
FIG. 2B is a cross-sectional view illustrating a P-FET isolated by the conventional STI structure.

First, referring to FIG. 3A, a blocking pattern 22 is formed on a semiconductor substrate 20 to expose an area for device isolation. The semiconductor substrate 20, which contains predetermined impurities, is defined as a cell area in which a memory device will be formed and core and periphery areas in which a P-FET will be formed. In FIG. 3A, a cell area A1 and core and periphery areas A2 are shown. The blocking pattern 22 may be formed of a material whose etch selectivity ratio with respect to silicon is very low and which inhibits oxidation. For example, the blocking pattern 22 may be a stack layer of a silicon oxide layer and a silicon nitride layer.

Afterwards, the semiconductor substrate 20 is dry etched to a predetermined depth using the blocking pattern 22 as a mask. As a result, a first trench T1 and a second trench T2 are formed in the semiconductor substrate 20. Herein, the first and second trenches T1 and T2 are shallow trenches for forming shallow trench isolation (STI) structures. Also, the first trench T1 is formed in the core and periphery areas A2 and the second trench T2 is formed in the cell area A1. Because the second trench T2 is formed in the cell area A1 that is dense with devices, it is narrower than the first trench T1 formed in the core and periphery areas A2. At this time, the etching process for forming the first and second trenches T1 and T2 may be a dry etching process using a plasma, which may cause silicon lattice defects and damage to the surfaces of the first and second trenches T1 and T2.

Next, as shown in FIG. 3B, a thermal oxide layer 24 is formed in the first and second trenches T1 and T2 by thermally oxidizing inner surfaces of the first and second trenches T1 and T2. This thermal oxidation cures the silicon lattice defects and damage to the substrate in the first and second trenches T1 and T2, and removes the sharp corners of the first and second trenches T1 and T2. Herein, "the inner surfaces of the first and second trenches T1 and T2" include the inside walls and bottom faces of the first and second trenches T1 and T2.

With reference to FIG. 3C, a photoresist pattern 26 is formed by a known photolithography process to expose the second trench T2 in the cell area A1. At this time, the photoresist pattern 26 shields the entire core and periphery areas A2 in which a P-FET will be formed. Afterwards, the thermal oxide layer 24 in the exposed cell area A1 is removed by an isotropic etching method which may be a wet or dry etching method. As a result, the inside of the second trench T2 in the cell area A1 is exposed. The silicon oxide layer constituting the blocking pattern 22 formed adjacent the second trench T2 may be lost due to the isotropic etching. Consequently, the upper corners of the second trench T2 become more rounded.

Figure 3D:
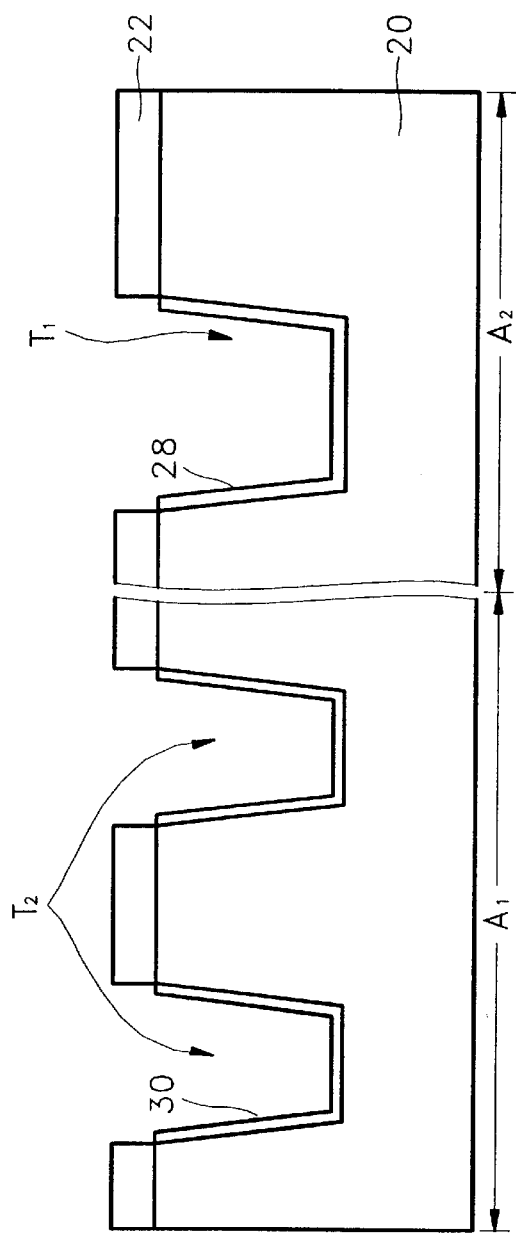

Referring to FIG. 3D, the photoresist pattern 26 (See FIG. 3) is removed by a plasma ashing method. Next, the resultant semiconductor substrate is thermally oxidized. Then, the thermal oxide layer 24 remaining in the first trench T1 is re-oxidized in the first trench T1, thereby forming a first sidewall oxide layer 28 thicker than the thermal oxide layer 24.

Exposed bare silicon is thermally oxidized in the second trench T2 thereby forming a second sidewall oxide layer 30 thinner than the first sidewall oxide layer 28. The thickness of the first sidewall oxide layer 28 is equal to the sum of the thicknesses of the second sidewall oxide layer 30 and the thermal oxide layer 24. The first sidewall oxide layer 28 is preferably formed to a thickness capable of preventing the penetration of electrons trapped in a liner formed later into the semiconductor substrate 20, for example, to a thickness of approximately 100 to 300 Å. And, the second sidewall oxide layer 30 is formed to a thickness that does not appreciably reduce data retention time of a DRAM device, for example, to a thickness of 20 to 100 Å. As a result, the thickness of the sidewall oxide layer 28 in the first trench T1 formed in the core and periphery areas A2 is different from the thickness of the sidewall oxide layer 30 in the second trench T2 formed in the cell area A1.

Figure 3E:
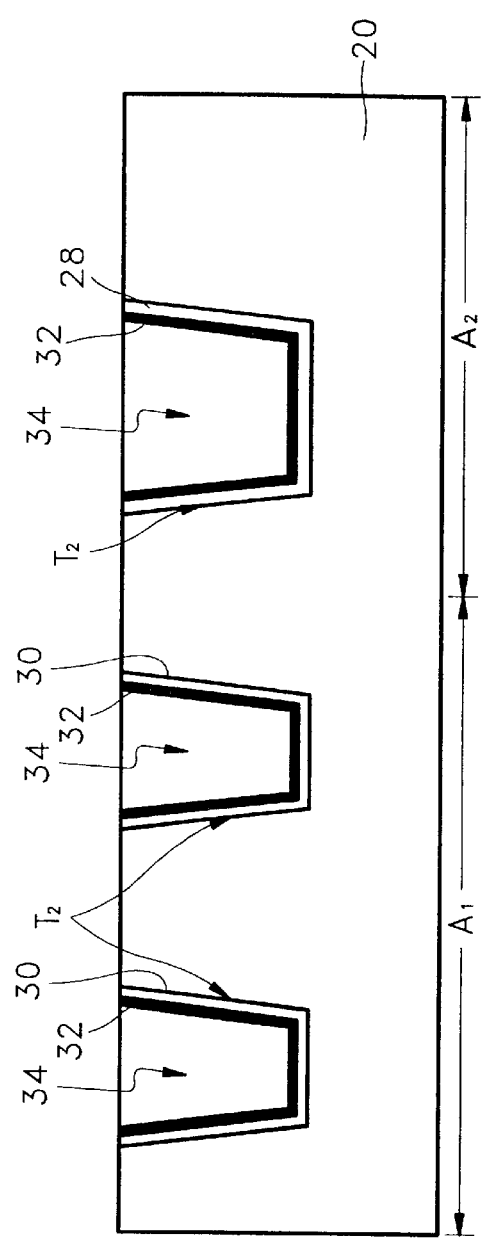

Afterwards, with reference to FIG. 3E, a liner 32 is formed on the surface of the blocking pattern 22 (not shown) and on the surfaces of the first and second sidewall oxide layers 28 and 30 in the trenches T1 and T2. As is well known, the liner 30 is interposed to relieve stress caused by a difference in the thermal expansive ratios of the silicon semiconductor substrate 20 and a silicon oxide layer, with which the trenches T1 and T2 are subsequently filled, during a later thermal process. It is preferable that such liner 32 be thinner than the first and second sidewall oxide layers 28 and 30. For example, the liner 32 may be a silicon nitride ($Si_xN_y$) layer or a silicon oxynitride (SiON) layer. Next, a trench-filling dielectric layer having an excellent interleave-filling property, for example, a high density plasma oxide layer is deposited to fully fill the trenches T1 and T2. Sequentially, the trench-filling dielectric layer, the liner 32 and the blocking pattern 22 are chemically and mechanically polished until the surface of the semiconductor substrate 20 is exposed. Consequently, the first and second trenches T1 and T2 are filled with the dielectric layer 34 and thus an STI layer 34 is completed.

Figure 4:
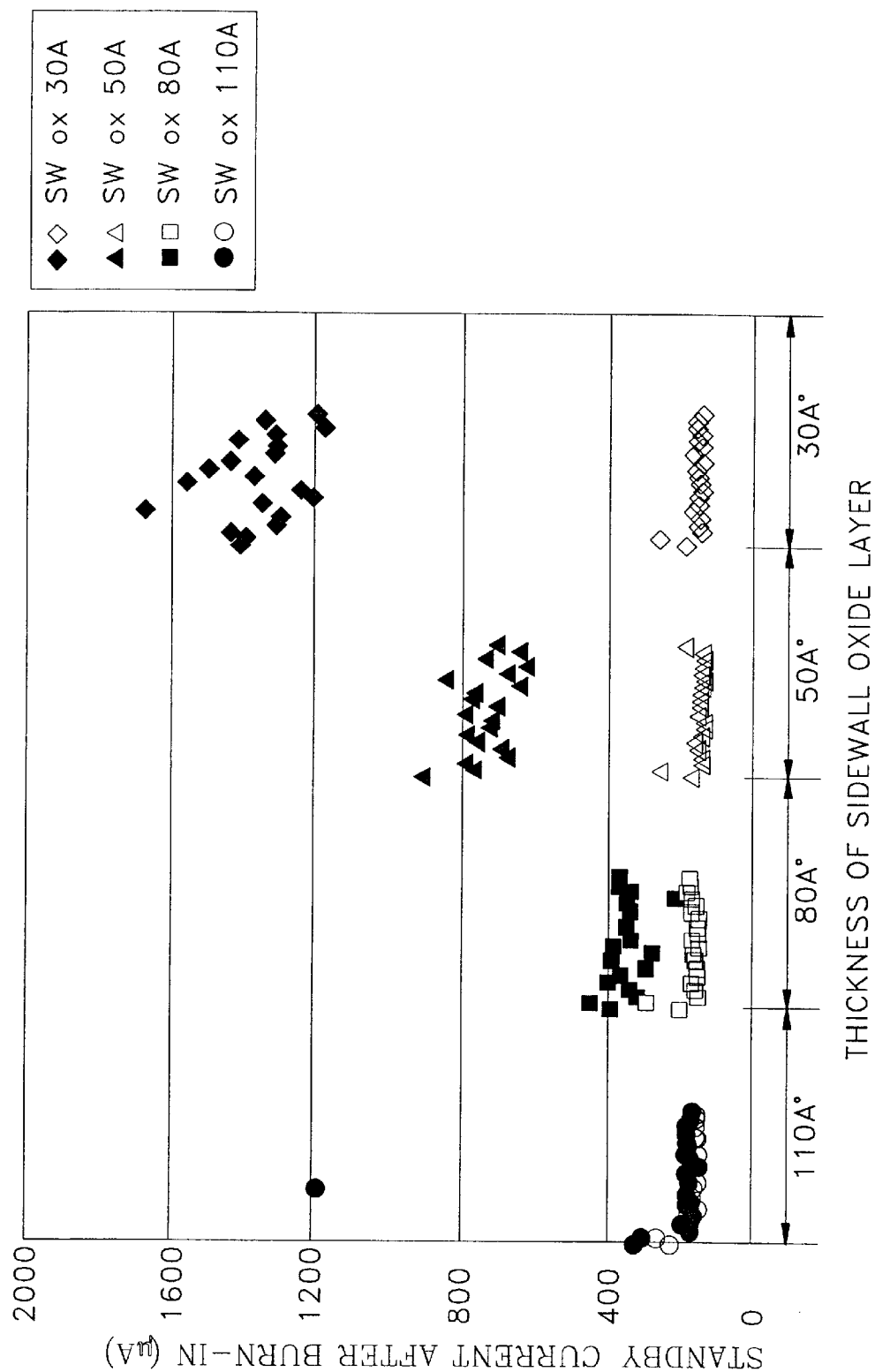
FIG. 4 is a graph showing standby current according to the thickness of a sidewall oxide layer in a trench for defining a P-FET.

FIG. 4 is a graph of standby current through a sidewall oxide layer formed in a trench defining core and periphery areas such as those of a P-FET, measured when the thickness of the sidewall oxide layer (SW ox) is 30 Å, 50 Å, 80 Å and 110 Å. Herein, ◇ and ◆ represent standby current when the thickness of the sidewall oxide layer is 30A, and △ and ▲ represent standby current when the thickness of the sidewall oxide layer is 50 Å. Also, □ and ■ represent standby current when the thickness of the sidewall oxide layer is 80 Å, and ○ and ● represent standby current when the thickness of the sidewall oxide layer is 110 Å. Hollow symbols represent standby current measured after the P-FET has been driven for 1 hour or less and solid symbols represent standby current measured after the P-FET has been driven for 48 hours. The thickness of the sidewall oxide layer is plotted on the X-axis and standby current after burn-in is plotted on the Y-axis.

According to FIG. 4, standby current is scarcely generated immediately after the P-FET is driven even when the sidewall oxide layer is thin. However, standby current is generated after 48 hours and the amount of such standby current is inversely proportional to the thickness of the sidewall oxide layer. That is, as the thickness of a sidewall oxide layer 40 in the trench T1 defining the P-FET is increased, standby current is reduced in proportion to the increase in thickness. According to the first preferred embodiment of the present invention, standby current can be reduced by forming a relatively thick sidewall oxide layer in the trench in the core and periphery areas requiring the P-FET.

According to the first preferred embodiment of the present invention, the sidewall oxide layers in the trenches in the cell area and the core and periphery areas may be formed to respectively different thicknesses using a mask only one time. As a result, data retention time of a DRAM device can be maintained and the generation of standby current after burn-in can be reduced.

Embodiment 2

The second preferred embodiment of the present invention is the same as the above-described first embodiment from the process of forming the trenches T1 and T2 to the process of forming the thermal oxide layer 24. Therefore, only processes after the formation process of the thermal oxide layer 24 will be described.

Figure 5A:
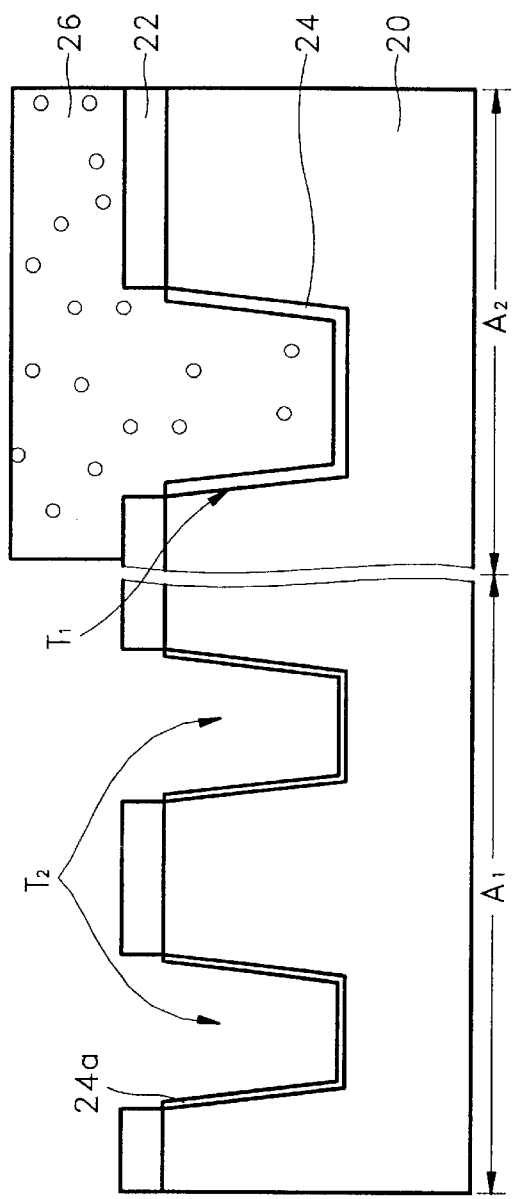
FIGS. 5A and 5B are cross-sectional views for describing a second embodiment of the present invention.

First, referring to FIG. 5A, a photo resist pattern 26 is formed by a photolithography process to expose the cell area A1. Afterwards, the thermal oxide layer 24 in the exposed cell area A1 is etched by an isotropic etching method. At this time, the thermal oxide layer 24 is etched, leaving a predetermined thickness thereof in the second trench T2. The silicon semiconductor substrate 20 is hydrophobic and thus is easily damaged by the isotropic etching. Consequently, the thermal oxide layer 24 is leftover to prevent such damage. Herein, reference numeral 24a denotes thermal oxide layer etched to a predetermined thickness.

Figure 5B:
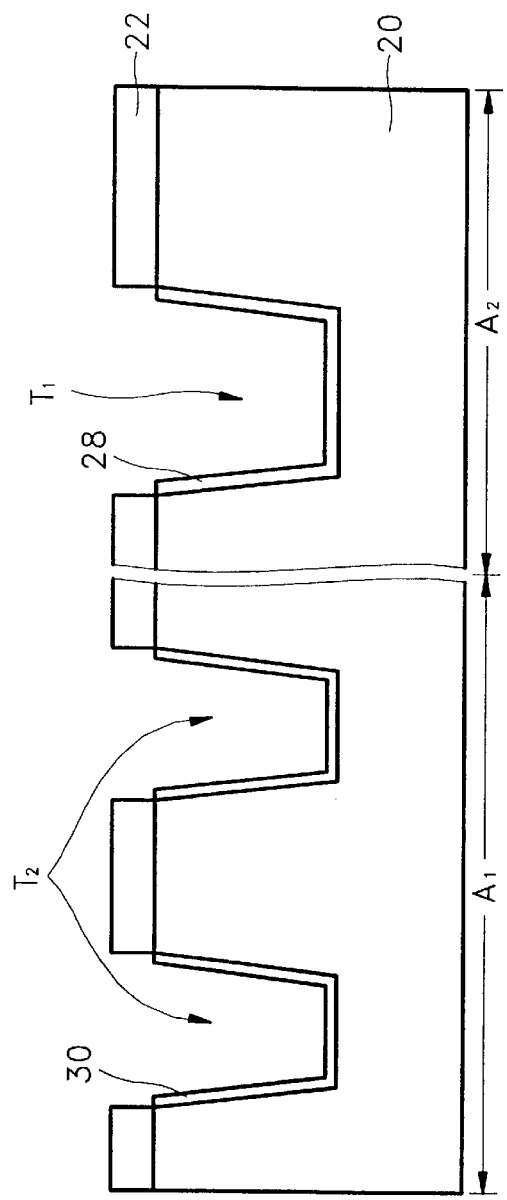

Afterwards, as shown in FIG. 5B, the photo resist pattern 26 (See FIG. 5A) is removed by a known method. Next, the thermal oxide layers 24 and 24a in the first and second trenches T1 and T2 are re-oxidized, thereby forming a first sidewall oxide layer 28 and a second sidewall oxide layer 30. Herein, the second sidewall oxide layer 28 is thinner than the first sidewall oxide layer 28 because the thermal oxide layer 24a in the second trench T2 is thinner than the thermal oxide layer 24 in the first trench T1.

Next, the same processes as those described in the first embodiment, for forming a liner and filling the trenches with a dielectric material, are performed but are not shown in FIGS. 5A and 5B.

According to the second embodiment, the thermal oxide layer is etched so that a portion thereof remains, thereby reducing damage to the semiconductor substrate.

Embodiment 3

The third preferred embodiment is the same as the first embodiment up to the process of forming the trenches T1 and T2. Therefore, only processes after the formation of the trenches T1 and T2 will be described.

Figure 6A:
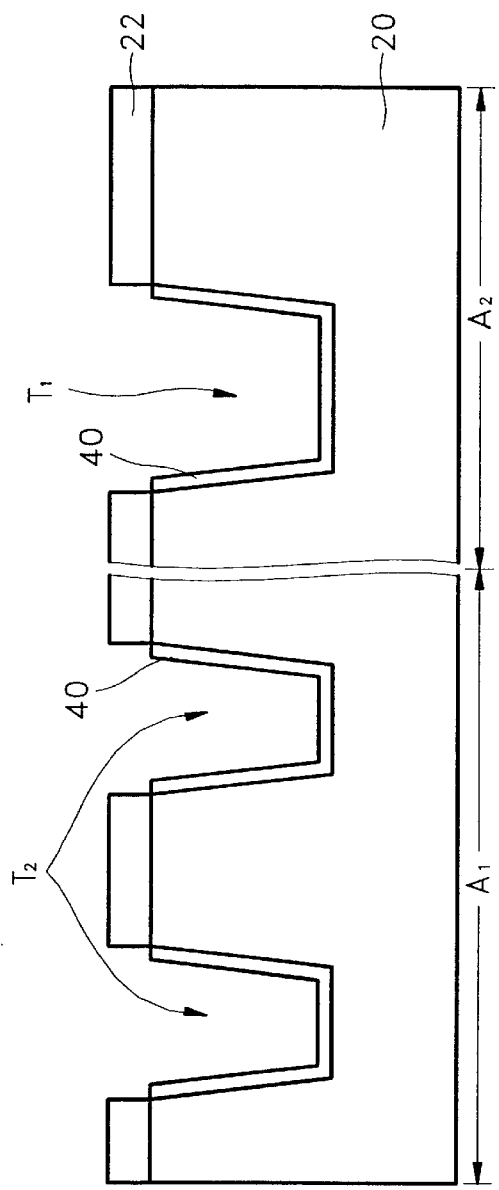
FIGS. 6A to 6C are cross-sectional views for describing a third embodiment of the present invention.

With reference to FIG. 6A, a first sidewall oxide layer 40 is formed by thermally oxidizing the inner surfaces of the trenches T1 and T2. At this time, the first sidewall oxide layer 40 is formed to a thickness capable of preventing the generation of standby current in the P-FET in the core and periphery areas A2. That is, the first sidewall oxide layer 40 is formed to the thickness capable of preventing the penetration into the semiconductor substrate of electrons trapped in a liner which will be formed by a subsequent process, for example, to a thickness of 100 to 300 Å.

Figure 6B:
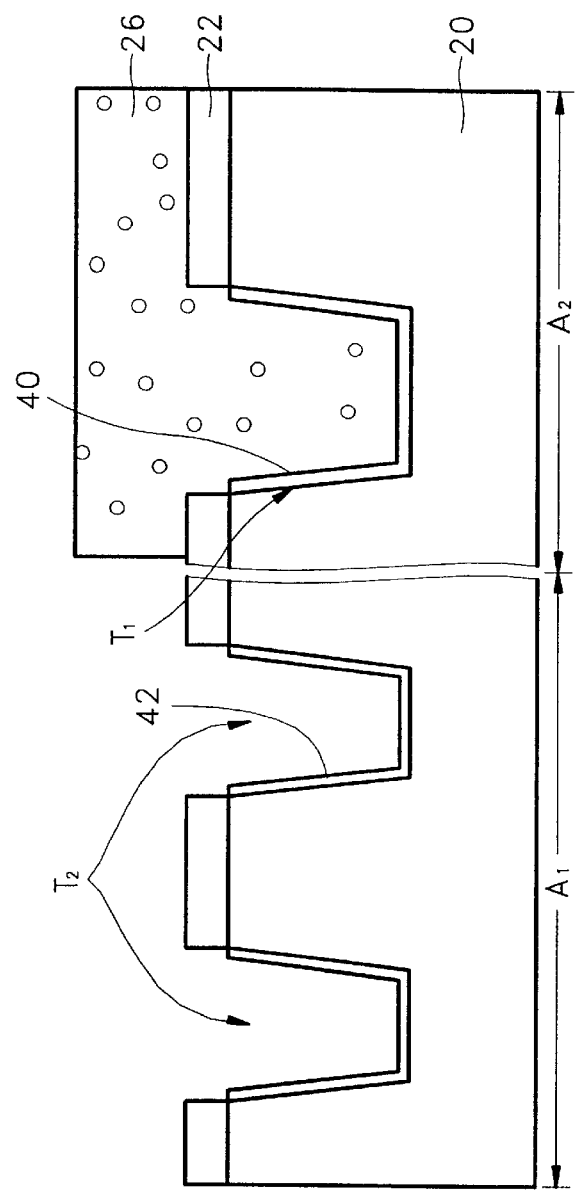

Next, as shown in FIG. 6B, a photo resist pattern 26 is formed by a known photolithography process to shield the core and periphery areas A2. Afterwards, the first sidewall oxide layer 40 in the trench T2 in the cell area A1, exposed by the photo resist pattern 26, is etched to a predetermined thickness thereby forming a second sidewall oxide layer 42. At this time, the second sidewall oxide layer 42 is etched to a thickness which does not reduce data retention time of a DRAM device, for example, leaving a thickness of 20 to 100 Å. As a result, the relatively thick first sidewall oxide layer 40 is formed in the trench T1 in the core and periphery areas A2 and the relatively thin second sidewall oxide layer 42 is formed in the trench T2 in the cell area A1.

Figure 6C:
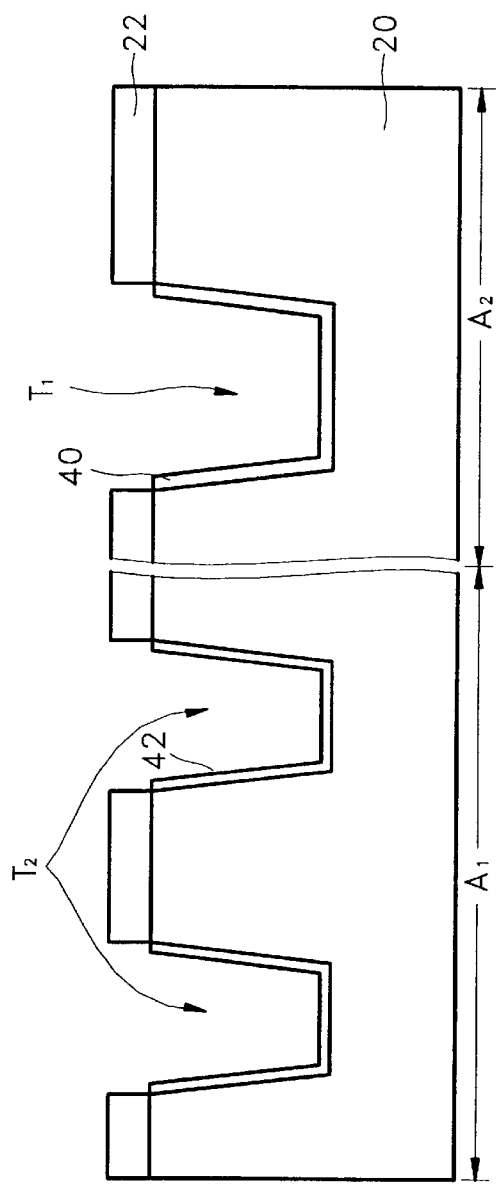

Referring to FIG. 6C, the photo resist pattern 26 is removed by a known method. Afterwards, processes for forming a liner on the surfaces of the first and second sidewall oxide layers 40 and 42 and filling the trenches T1 and T2 with a dielectric layer are the same as those of the above-described first embodiment.

As described, in the third embodiment the entire sidewall oxide layer is thickly formed and is partially removed in the cell area, thereby forming the sidewall oxide layers having different thicknesses in the respective areas.

Embodiment 4

The fourth preferred embodiment may be the same as any one of the above-described first through third embodiments in a method of manufacturing a semiconductor device having an STI structure, except the location of the STI layer. In the above described first through third embodiments, the relatively thick first sidewall oxide layers 28 and 40 are formed in the trench T1 in the core and periphery areas requiring the P-FET and the relatively thin second sidewall oxide layers 30 and 42 are formed in the trench T2 in the cell area. However, referring to FIG. 7, in the fourth embodiment, a relatively thick first sidewall oxide layer 28 or 40 is formed in a trench T3 for defining areas between P-FETs in the core and periphery areas. Also, a relatively thin second sidewall oxide layer 30 or 42 is formed in a trench T2 in the cell area as well as in a trench T4 defining other circuit devices, but not in a trench defining the P-FETs in the core and periphery areas. That is, in the fourth embodiment, the trench, in which the second sidewall oxide layer 30 or 42 is formed, may be between N-FETs, an N-FET and a P-FET, an N-FET or other circuit devices, a P-FET and other circuit devices, and other circuit devices.

Figure 7:
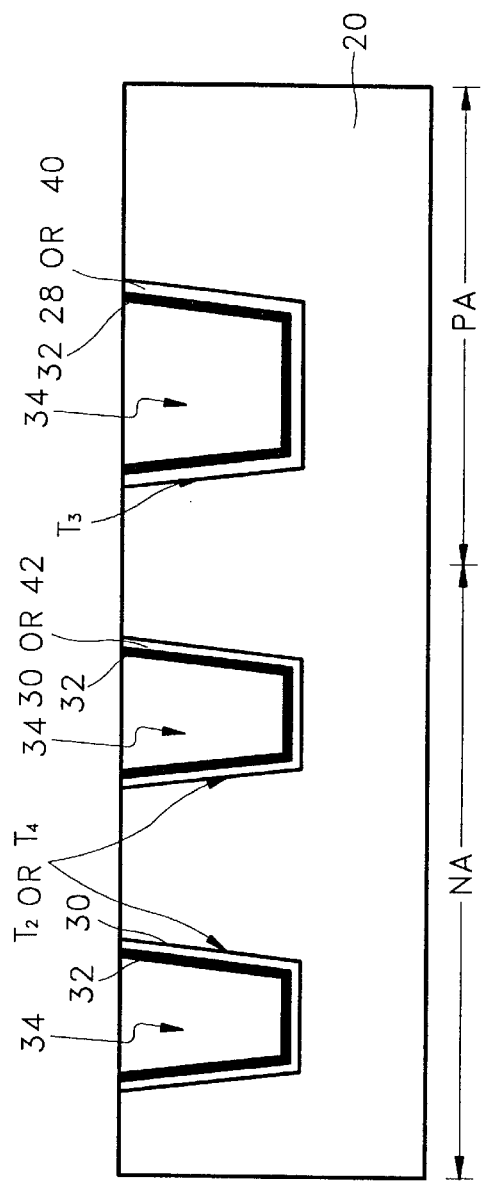
FIG. 7 is a cross-sectional view of a semiconductor device having an STI structure for describing a fourth embodiment of the present invention.

At this time, the fourth embodiment may be the same as any one of the above-described first through third embodiments in the manufacturing method. Also, in the respective embodiments, the processes of forming photoresist patterns are performed after the cell area is exposed and the trench T4 is further exposed but not the trench T3 defining the P-FET in the core and periphery areas. Referring to FIG. 7, NA denotes an area including other trenches but not a trench defining the P-FET, and PA denotes an area in which a trench defining the P-FET is formed.

As described above, according to the present invention, the relatively thin sidewall oxide layer is formed in the trench for isolating the devices in the cell area so that data retention time of a DRAM device is not reduced. Meanwhile, the relatively thick sidewall oxide layer is formed in the trench for defining the P-FET so that abnormally increased standby current after burn-in is not generated. Consequently, the characteristics of the DRAM device can be improved and leakage current in the P-FET area can be reduced.

Although the invention has been described with reference to preferred embodiments, it will be apparent to one of ordinary skill in the art that modifications of the described embodiments may be made without departing from the spirit and scope of the invention.

What is claimed is:

1. A method of manufacturing a semiconductor device having an STI structure, comprising:

forming a first trench and a second trench in selective areas of a semiconductor substrate;

forming a first sidewall oxide layer on an inner surface of the first trench and a second sidewall oxide layer on an inner surface of the second trench, the second sidewall oxide layer having a thickness less than the first sidewall oxide layer;

forming a liner on surfaces of the first and second sidewall oxide layers; and filling the first and second trenches with a dielectric material, wherein forming the first and second sidewall oxide layers comprises:

forming an initial oxide layer on the inner surfaces of the first and second trenches;

selectively removing the initial oxide layer in the second trench; and forming a first sidewall oxide layer and a second sidewall oxide layer by oxidizing the initial oxide layer in the first trench and the inner surface of the second trench.

2. The method of claim 1, wherein the first trench defines P-FETs and the second trench defines N-FETs, an N-FET and a P-FET, an N-FET and other circuit devices, a P-FET and other circuit devices, and other circuit devices.

3. The method of claim 1, wherein the initial oxide layer in the second trench is removed by an isotropic etching method.

4. The method of claim 1, wherein in removing the initial oxide layer in the second trench, the initial oxide layer is etched to leave a predetermined thickness thereof on the inner surface of the second trench.

5. The method of claim 4, wherein the oxide layer in the second trench is removed by an isotropic etching method.

6. The method of claim 1, wherein the first sidewall oxide layer is formed to a thickness capable of preventing a significant increase in standby current after burn-in in the P-FET, and the second sidewall oxide layer is formed to a thickness that does not appreciably change a predetermined data retention time of a memory device.

7. The method of claim 1, wherein forming the first and second sidewall oxide layers comprises:

forming the first sidewall oxide layer to a predetermined thickness on the inner walls of the first and second trenches; and forming the second sidewall oxide layer by etching the first sidewall oxide layer on the inner surface of the second trench to a predetermined thickness thereof.

8. The method of claim 7, wherein the first sidewall oxide layer is formed to a thickness capable of preventing a significant increase in standby current after burn-in in the P-FET, and the second sidewall oxide layer is formed to a thickness that does not change a predetermined data retention time of a memory device.

9. A method of manufacturing a semiconductor device having an STI structure, comprising:

providing a semiconductor substrate having core and periphery areas in which a FET and other circuit devices are formed, and a cell area in which a memory device is formed;

forming a first trench and a second trench in selective portions of the core area, the periphery area, and cell area of the semiconductor substrate;

forming an initial oxide layer on inner surfaces of the first and second trenches;

removing the initial oxide layer in the second trench;

forming first and second sidewall oxide layers on the inner surfaces of the first and second trenches by oxidizing the initial oxide layer in the first trench and the inner surface of the second trench, the second sidewall oxide layer having a thickness less than the first sidewall oxide layer;

forming a liner on surfaces of the first and second sidewall oxide layers; and filling the first and second trenches with a dielectric material.

10. The method of claim 9, wherein the initial oxide layer is formed by thermally oxidizing the inner surfaces of the first and second trenches.

11. The method of claim 10, wherein removing the initial oxide layer in the second trench comprises:

forming a photo resist pattern over the semiconductor substrate to expose the second trench;

removing the initial oxide layer in the exposed second trench by an isotropic etching method; and removing the photo resist pattern.

12. The method of claim 11, wherein the initial oxide layer in the exposed second trench is removed by the isotropic etching method to leave a predetermined thickness thereof in the second trench.

13. The method of claim 11, wherein the first trench is formed in the core and periphery areas and the second trench is formed in the cell area.

14. The method of claim 11, wherein the first trench is formed in an area for defining P-FETs in the core and periphery areas and the second trench is formed in the cell area and in an area for defining N-FETs, an N-FET and a P-FET, an N-FET and other circuit devices, and a P-FET and other circuit devices, and other circuit devices in the core and periphery areas.

15. The method of claim 13, wherein the first sidewall oxide layer in the first trench is formed to a thickness capable of preventing a significant increase in standby current after burn-in in the P-FET, and the second sidewall oxide layer is formed to a thickness that does not appreciably reduce a predetermined data retention time of a memory device.

16. The method of claim 14, wherein the first sidewall oxide layer in the first trench is formed to a thickness capable of preventing a significant increase in standby current after burn-in in the P-FET, and the second sidewall oxide layer is formed to a thickness that does not appreciably reduce a predetermined data retention time of a memory device.

17. The method of claim 9, wherein the liner is one selected from the group consisting of a silicon nitride layer and a silicon oxynitride layer.

18. The method of claim 9, wherein filling the first and second trenches with a dielectric material comprises:

forming an dielectric material to fully fill the first and second trenches; and planarizing the dielectric material to expose the semiconductor substrate surface.

19. The method of claim 18, wherein the dielectric material is a high density plasma oxide layer.

20. A method of manufacturing a semiconductor device having an STI structure, comprising:

providing a semiconductor substrate having core and periphery areas in which a P-FET and other circuit devices are formed, and a cell area in which a memory device is formed;

forming a first trench and a second trench in selective portions of the core area, the periphery area and the cell area of the semiconductor substrate;

forming a first sidewall oxide layer to a predetermined thickness on inner surfaces of the first and second trenches;

forming a second sidewall oxide layer by etching the first sidewall oxide layer in the second trench to a predetermined thickness;

forming a liner on surfaces of the first and second sidewall oxide layers; and filling the first and second trenches with a dielectric material.

21. The method of claim 20, wherein the first sidewall oxide layer is formed by thermally oxidizing the inner surface of the first and second trenches.

22. The method of claim 21, wherein etching the first sidewall oxide layer in the second trench to a predetermined thickness comprises:

forming a photo resist pattern over the semiconductor substrate to expose the second trench;

etching the first sidewall oxide layer in the second trench to a predetermined thickness; and removing the photo resist pattern.

23. The method of claim 22, wherein the first trench is formed in the core and periphery areas and the second trench is formed in the cell area.

24. The method of claim 23, the first sidewall oxide layer in the first trench is formed to a thickness capable of preventing a significant increase in standby current after burn-in in the P-FET, and the second sidewall oxide layer is formed to a thickness that does not appreciably reduce a predetermined data retention time of a memory device.

25. The method of claim 22, wherein the first trench is formed in an area for diving P-FETs in the core and periphery areas and the second trench is formed in the cell area and in an area for diving N-FETs, an N-FET and a P-FET, an N-FET and other circuit devices, and a P-FET and other circuit devices, and other circuit devices in the core and periphery areas.

26. The method of claim 25, wherein the first sidewall oxide layer in the first trench is formed to a thickness capable of preventing a significant increase in standby current after burn-in in the P-FET, and the second sidewall oxide layer is formed to a thickness that does not appreciably reduce a predetermined data retention time of a memory device.

27. The method of claim 20, wherein the liner is one selected from the group consisting of a silicon nitride layer and a silicon oxynitride layer.

28. The method of claim 20, wherein filling the first and second trenches with a dielectric material comprises:

forming a dielectric material to fully fill the first and second trenches; and planarizing the dielectric material to expose the semiconductor substrate surface.

29. The method of claim 28, wherein the dielectric material is a high density plasma oxide layer.

* * * * *

UNITED STATES PATENT AND TRADEMARK OFFICE
CERTIFICATE OF CORRECTION

PATENT NO.   : 6,656,783 B2
DATED        : December 2, 2003
INVENTOR(S)  : Park

It is certified that error appears in the above-identified patent and that said Letters Patent is hereby corrected as shown below:

Column 2,
Line 41, "after bum-in, is" should read -- after burn-in, is --.

Column 3,
Lines 26 and 67, "after bum-in in" should read -- after burn-in in --

Column 9,
Line 37, "trenches: selectively" should read -- trenches; selectively --.
Line 59, "after bum-in in" should read -- after burn-in in --.

Column 10,
Line 6, "after bum-in in" should read -- after burn-in in --.
Line 13, "a FET and" should read -- a P-FET and --.

Column 12,
Line 9, "claim 23, the first" should read -- claim 23, wherein the first --.

Signed and Sealed this

Sixth Day of July, 2004

JON W. DUDAS
*Acting Director of the United States Patent and Trademark Office*